United States Patent [19]

Owen et al.

[11] 4,326,134

[45] Apr. 20, 1982

[54] INTEGRATED RISE-TIME REGULATED VOLTAGE GENERATOR SYSTEMS

[75] Inventors: William H. Owen, Mountain View; Richard T. Simko, Los Altos; Wallace E. Tchon, Sunnyvale, all of Calif.

[73] Assignee: Xicor, Inc., Los Altos, Calif.

[21] Appl. No.: 71,498

[22] Filed: Aug. 31, 1979

[51] Int. Cl.³ .................................................. H03K 3/57
[52] U.S. Cl. .................................... 307/268; 307/246; 307/264
[58] Field of Search ............... 307/246, 261, 264, 268, 307/296, 237, 228

[56] References Cited

U.S. PATENT DOCUMENTS

| | | | |
|---|---|---|---|
| 3,631,259 | 12/1971 | Kiyota | 307/110 |
| 3,845,331 | 10/1974 | Luscher | 307/304 |
| 3,942,047 | 3/1976 | Buchanan | 411/36 |
| 4,124,806 | 11/1978 | Rusznyak | 307/264 |

*Primary Examiner*—John Zazworsky
*Attorney, Agent, or Firm*—Fitch, Even, Tabin, Flannery & Welsh

[57] ABSTRACT

Integrated circuit system for generating a rise-time regulated and level controlled high voltage pulse utilizing a plurality of diode-connected stages driven by capacitively coupled low voltage clocks. The maximum output voltage may be controlled by a gated diode reference device, which provides a reference voltage independent of power supply voltage. A feedback circuit may be provided which controls the high voltage rise time by modulating the effective low voltage clock amplitude driving the high voltage generator. A MOS logic level interface circuit may also be provided for sensing achievement of the predetermined high voltage level.

12 Claims, 12 Drawing Figures

HIGH VOLTAGE GENERATOR
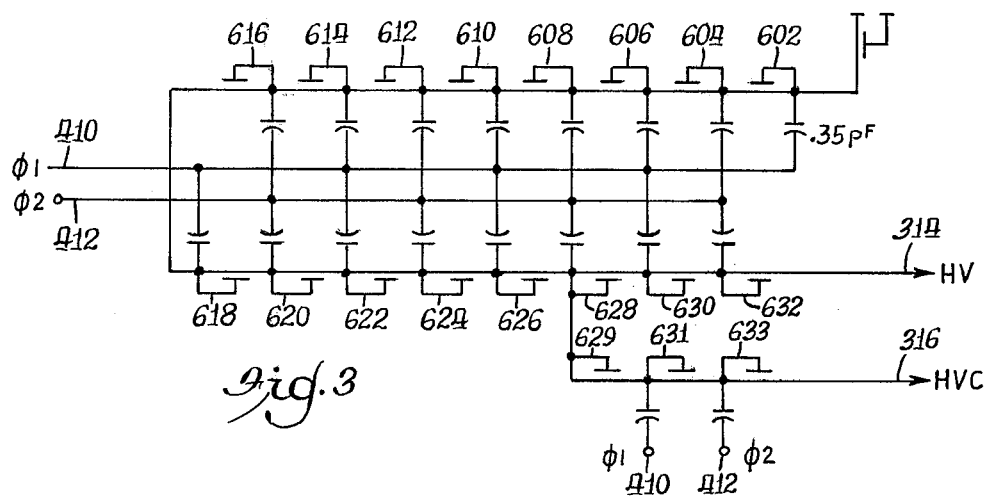
Fig.3
Fig.4
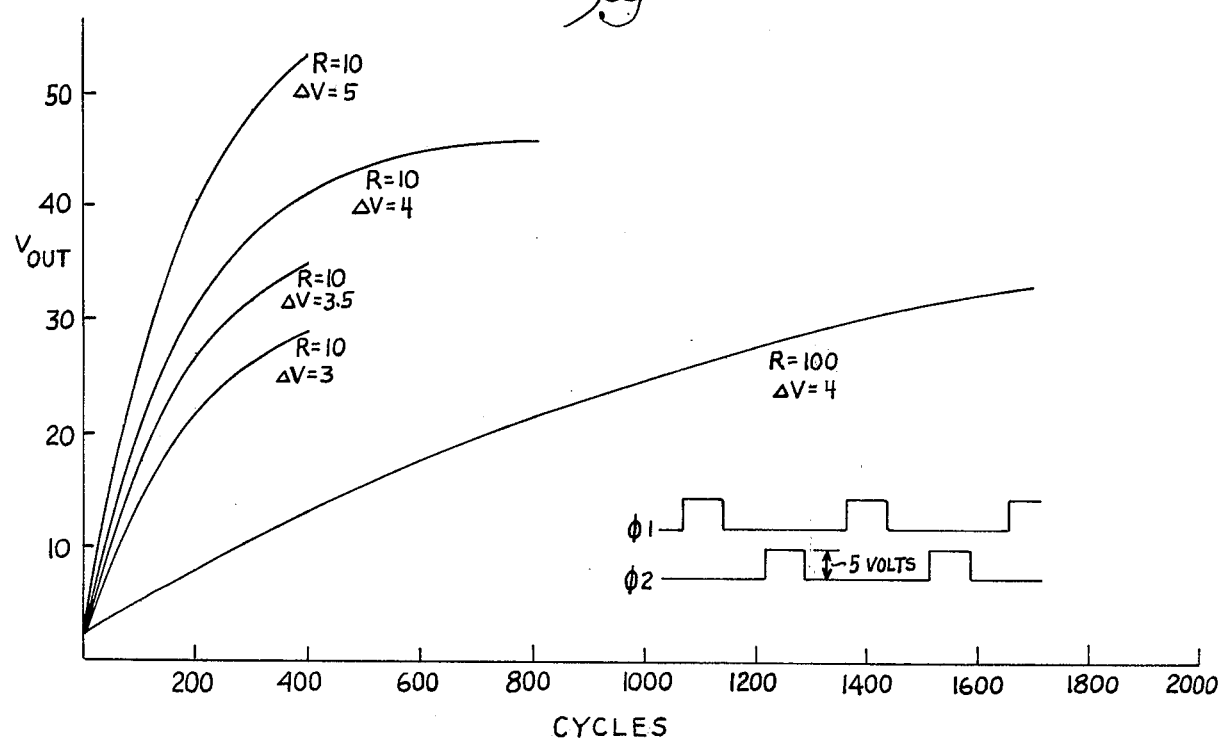

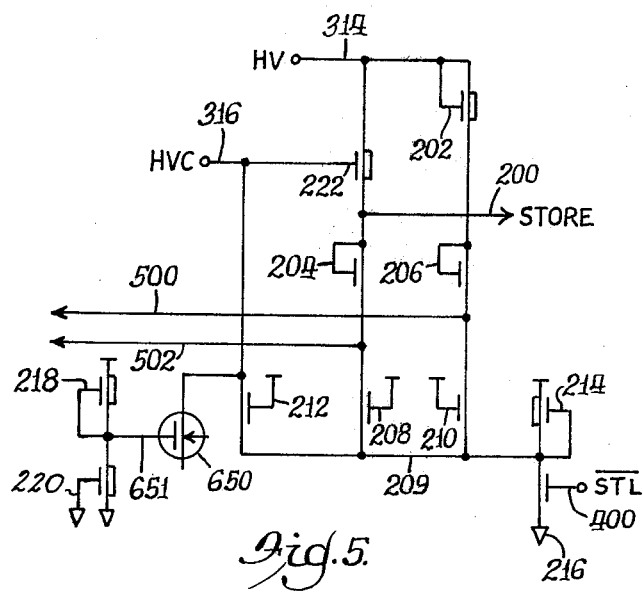
Fig. 5.
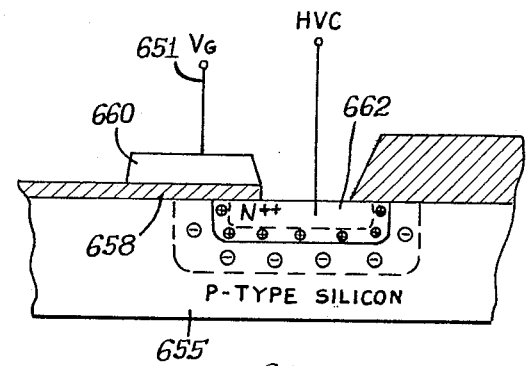
Fig. 6.
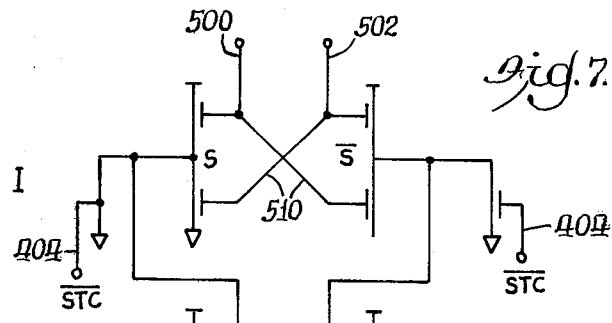
Fig. 7.
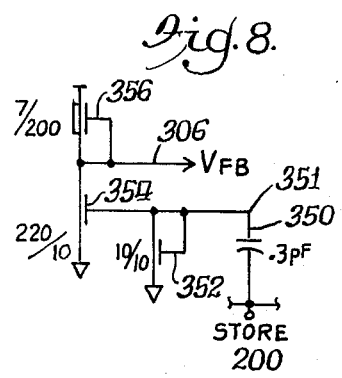
Fig. 8.
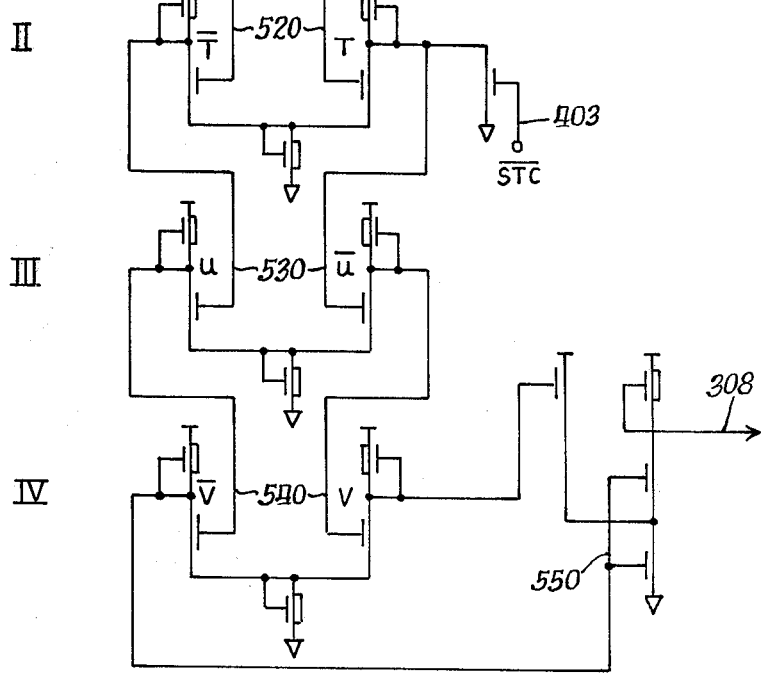

INTEGRATED RISE-TIME REGULATED VOLTAGE GENERATOR SYSTEMS

This application is related to copending applications Ser. Nos. 6,026, 6,029 and 6,030 all filed on Jan. 24, 1979.

The present invention relates generally to the field of logic level interfaced, high voltage generator integrated circuit systems, and more particularly relates to logic level interfaced, rise-time regulated, gated diode referenced high voltage generator integrated circuit systems which are particularly adapted for operation of nonvolatile integrated circuit memory systems incorporating integrated floating gate circuit elements for information storage as an electrical charge condition of the floating gate elements.

Many integrated circuit memory systems employ bistable semiconductor circuits such as flip-flop circuits as memory cells for storing binary data (ones and zeros). For such static memory cells to store information, electrical current from an electrical power source must continually flow in one of the two cross-coupled circuit branches, and be relatively absent from the other branch. Two (binary) distinguishable memory states for information storage are thereby provided, depending upon which branch is conductive, and which branch is correspondingly nonconductive. Accordingly, such semiconductor memory cells are considered to be "volatile" because if electrical power is removed, the memory state distinguishing current will cease to flow in the current carrying branch, and the information in the cell is accordingly lost. Other types of dynamic integrated circuit memory systems require power for continuously periodic refreshing of the dynamic memory cells, or the information is similarly lost. Such volatility is a substantial disadvantage of conventional semiconductor memory systems, and substantial effort in the art has been made to develop circuit elements and structures for providing nonvolatility to semiconductor circuits when power is removed [E. Harari, et al., "A 256-Bit Nonvolatile Static RAM", 1978 IEEE International Solid State Circuits Conference Digest, pp. 108–109; F. Berenga, et al., "E$^2$PROM TV Synthesizer", 1978 IEEE International Solid State Circuits Conference Digest, pp. 196–197; M. Horne, et al., "A Military Grade 1024-Bit Nonvolatile Semiconductor RAM", IEEE Trans. Electron Devices, Vol. ED-25, No. 8 (1978), pp. 1061–1065; Y. Uchida, et al., "1 K Nonvolatile Semiconductor Read/Write RAM", IEEE Trans. Electron Devices, Vol. ED-25, No. 8 (1978), pp. 1065–1070; D. Frohmann, "A Fully-Decoded 2048-Bit Electrically Programmable MOS-ROM", 1971 IEEE International Solid State Circuits Conference Digest, pp. 80–81; U.S. Pat. No. 3,660,819; U.S. Pat. No. 4,099,196; U.S. Pat. No. 3,500,142; DiMaria, et al., "Interface Effects and High Conductivity in Oxides Grown from Polycrystalline Silicon", Applied Phys. Letters (1975), pp. 505–507; R. M. Anderson, et al., "Evidence for Surface Asperity Mechanism of Conductivity in Oxide Grown on Polycrystalline Silicon", J. of Appl. Phys., Vol. 48, No. 11 (1977); pp. 4834–4836].

Devices based on MOS floating gate structures are conventionally used for systems having prolonged data retention. A floating gate is an island of conducting material, electrically insulated from the substrate but capacitively coupled to the substrate, forming the gate of a MOS transistor. Depending on the presence or absence of charge on this floating gate, the MOS transistor will be rendered conductive ("on") or nonconductive ("off"), thus forming the basis for memory device storage of binary "1" or "0" data corresponding to the presence or absence of floating gate charge. Various means for introducing and removing the signal charge from the floating gate are known. Once the charge is on the gate, it remains permanently trapped, because the floating gate is completely surrounded by an insulating material which acts as a barrier to the discharging of the floating gate.

Charge may be introduced onto, and removed from a floating gate element of a memory cell by application of relatively high voltage (with respect to the voltage potential of logic level signals) pulses to develop high tunneling fields across the floating gate insulating dielectric or high device currents. Such high voltage pulses have conventionally been provided from external power supply circuits, which have a number of disadvantages in terms of providing desired controlled pulse shapes and voltages in an easily controlled and cost-effective manner. In this regard, there is a need for reliable, integrated circuit logic level voltage powered high voltage generator systems which are adapted to provide controlled high voltage pulses for nonvolatile memory systems.

It is relatively simple to generate high voltage using discrete components as is well known and widely used for many applications. Further, circuits generating high voltages realized as monolithic integrated circuits have been used in simple devices such as watch circuits, often to drive liquid crystal display modules. However, such usage requires little need for precise time or level control of the generated pulses. Accordingly, there is a need for high voltage generator systems for producing well controlled high voltage pulses which may be realized as a portion of a low voltage controlled integrated circuit, and it is an object of the present invention to provide such systems.

It is a further object to provide methods and integrated circuit devices that produce high voltage pulses with well controlled rise times and peak voltage levels which can be realized as a portion of an integrated circuit interfaced with other circuit members at low level logic voltages. Another object is to provide such methods and integrated circuit devices which may be adapted to provide relatively long-time constants such as about one millisecond.

These and other objects will become apparent from the following detailed description and accompanying drawings, of which:

FIG. 1A is a circuit schematic of an alternative portion of the generator circuit of FIG. 1;

FIG. 3 is an illustration of high voltage generator subcircuit of the embodiment of FIG. 1;

FIG. 4 is a graph of the output of the high voltage circuit embodiment of FIG. 1 as a function of phase cycles;

FIG. 5 is an illustration of a high voltage control subcircuit of the embodiment of FIG. 1;

FIG. 6 is an illustration of a gated diode clamp device utilized in the embodiment of FIG. 1;

FIG. 7 is an illustration of a high voltage sense subcircuit of the embodiment of FIG. 1;

FIG. 8 is an illustration of a high voltage feedback subcircuit of the embodiment of FIG. 1;

Generally, the present invention is directed to methods and apparatus for generating high voltage signals comprising charge pump means for pumping charge packets along a plurality of discrete series-connected stages of increasing potential by means of applied clocked pumping potential to provide an output potential at a load output terminal which exceeds the applied pumping potential, and to provide a reference output potential which exceeds the applied pumping potential. The charge pump means may desirably be driven by two-phase, non-overlapping clock signals such as non-overlapping level signals having a duty cycle of less than 50 percent and a peak-to-peak voltage of about 10 volts or less, and preferably low logic level signals having a peak-to-peak voltage of about 5 volts or less. The circuitry may further include means for limiting the reference output potential to a predetermined reference potential value, and means for controlling the rise-time of the output potential and the rise time of the reference output potential in a predetermined manner, which may desirably although not necessarily be such that the rise time of the output potential for a given output impedance is more than the rise time of the reference potential. The means for limiting the reference output potential may desirably utilize the reverse breakdown characteristic of a gated diode element to provide a high voltage, accurately controllable voltage limitation means. A feedback circuit may be utilized to control the voltage pulse rise times, as will be more fully described.

Figure 1:
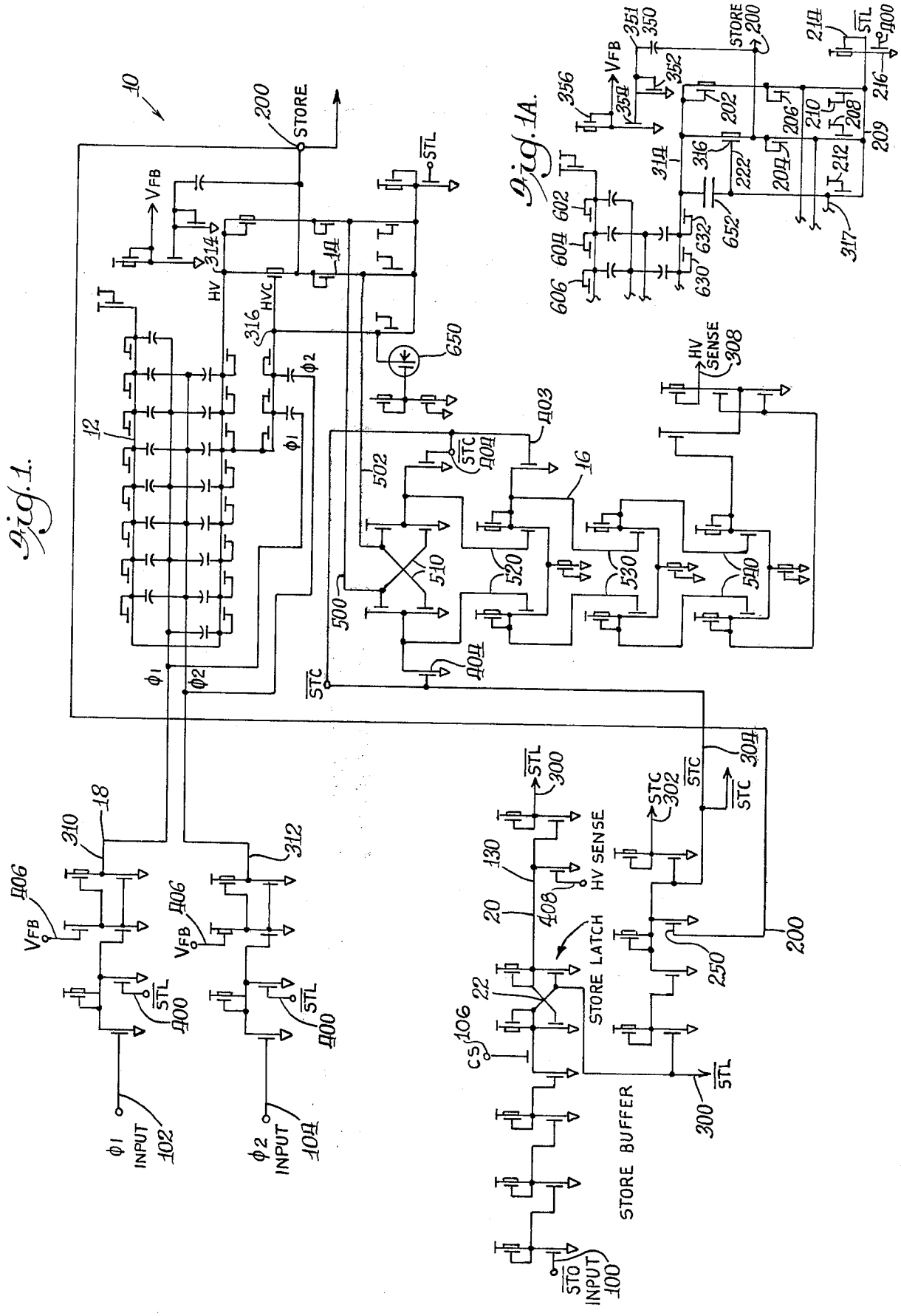
FIG. 1 is a full circuit schematic of an embodiment of a logic level interfaced rise-time regulated, gated diode referenced high voltage generator circuit in accordance with the present invention.

Turning now to the drawings, an embodiment 10 of a high voltage generator circuit is shown in FIG. 1 which is adapted to provide a controlled, high voltage output signal pulse STORE, which is particularly adapted for use in a nonvolatile memory integrated circuit such as described in concurrently executed copending application Ser. No. 71,499 entitled "Nonvolatile Static Random Access Memory System", which is incorporated by reference herein.

The circuit 10 comprises a charge pump section 12 which is described in more detail with reference to FIGS. 3, 9 and 10, a high voltage control section 14 which is described in more detail with reference to FIG. 5, a high impedance, high voltage sense circuit 16 which is described in more detail with reference to FIG. 7, and a high voltage feedback subcircuit 18 which is described in more detail with reference to FIG. 8.

The circuit 10 further includes store buffer logic circuit 20 for generating logic control signals for the circuit 10.

As indicated on FIG. 1, four external signals are provided to the high voltage generator circuit 10. These four input signals are logic level $\overline{STO}$ input signal 100, logic level chip select input signal CS 106, $\phi 1$ 102, $\phi 2$ 104, where $\phi 1$ and $\phi 2$ are non-overlapping two phase clock signals. The TTL logic level store input signal $\overline{STO}$ may be provided directly to an integrated circuit terminal input pin, and is utilized to initiate a high voltage pulse generator cycle. The chip select signal CS is a conventional TTL logic level signal utilized for RAM memory devices, for logical chip selection in systems having an array of integrated circuit "chips".

The desired high voltage output signal of the circuit 10 is STORE signal 200. Internal control signals utilized by the circuit 10 are store latch signal $\overline{STL}$ 300, store control signals STC 302 and $\overline{STC}$ 304, high voltage feedback control signal $V_{FB}$ 306, high voltage sense signal HV Sense 308, and two phase charge pump driving signals $\phi 1$ 310 and $\phi 2$ 312. The internal control signals are applied to nodes 400, 403, 404, 406, 408, 410 and 412, respectively.

Figure 2:
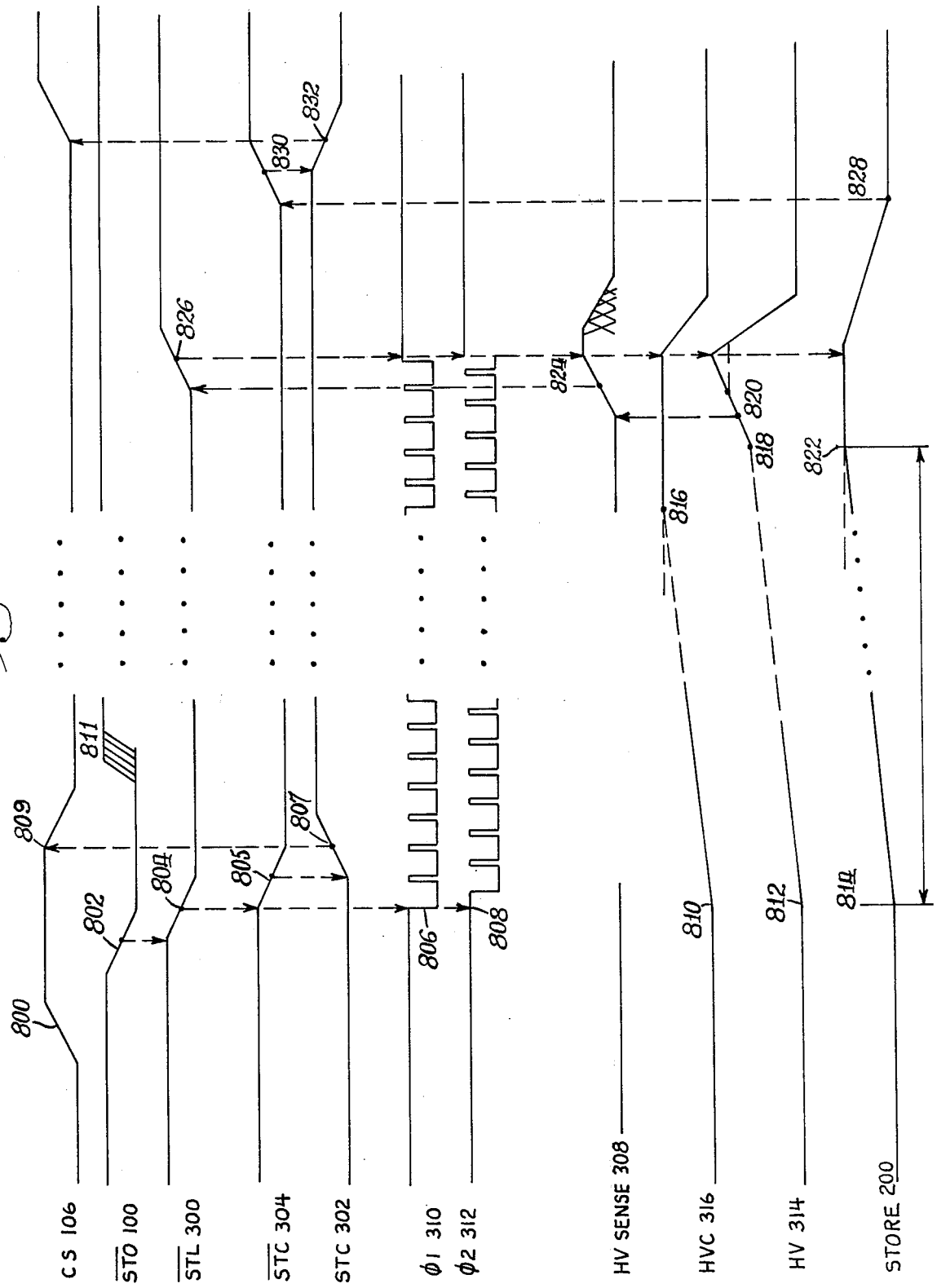
FIG. 2 is an illustration of circuit timing relationships in respect of the embodiment of FIG. 1.

FIG. 2 describes the timing relationship of the various signals, and a typical cycle in the operation of the circuit 10 will now be described with reference to FIGS. 1 and 2. The numerals referring to the signal timing positions of FIG. 2 are shown in brackets for convenience of reference. The circuit 10 is initially selected by bringing input chip select signal CS 106 from a low state to a high state [800]. The chip select signal CS is applied to the gate of a MOS transistor as indicated in FIG. 1 to control whether the store latch 22 of the store buffer 20 can be modified by a signal arising from $\overline{STO}$ Input 100. In the initial condition, the internal logic signal $\overline{STL}$ is normally high. With input signal CS high, if input signal $\overline{STO}$ goes low [802], this causes store latch 22 to latch and thereby the internal logic signal $\overline{STL}$ to go low [804]. As seen in FIG. 2, when STC 302 goes high, this causes CS 106 to be overridden and held at ground from time 809 through the rest of the high voltage generating cycle. This prevents the state of any external CS 106 signal from having any effect on the circuit 10 until the circuit 10 has been fully reinitialized at the end of the high voltage generation cycle. Also as seen in FIG. 2, once CS 106 is internally held low at time 809, the $\overline{STO}$ 100 signal can go high at any time 811 without affecting circuit 10 operation. As described in greater detail below, the CS 106 line is internally freed at time 832 as $\overline{STC}$ 302 goes low. The $\overline{STL}$ signal going low in turn causes internal control signal $\overline{STC}$ 304 to go low [805] and concommitantly causes signal STC 302 to go high [807]. $\overline{STC}$ low is fed to the first stage 404 of the high voltage sense circuit 16 and releases the voltage translator 510 so as to sense differences between signals HV and HVC from the charge pump 12, which signals are provided to the high voltage sense circuit 16 by respective conductor lines 500, 502. $\overline{STC}$ low applied to input 403 of the high voltage sense circuit 16 similarly releases stages II 520, III 530 and IV 540 of the high voltage sense circuit 16, which can further amplify and translate differences between the HV signal 500 and the HVC signal 502. $\overline{STC}$ high applied to input 403 of voltage translator 520 sets HV Sense 308 to its initial state, which is low. $\overline{STL}$ low applied at inputs 400 of the feedback control circuit 18 causes nonoverlapping charge pump clock signals $\phi 1$ 310 and $\phi 2$ 312 to begin oscillating [806] and [808]. The action of $\overline{STL}$ low is simply to allow external $\phi 1$ input 102 and external $\phi 2$ input 104 to propagate to $\phi 1$ 310 and $\phi 2$ 312. However, the amplitude of $\phi 1$ and $\phi 2$ at the outputs 310, 312 of circuit 18 as a function of the amplitude of the corresponding $\phi 1$, $\phi 2$ input signals 102, 104, is controlled by the feedback voltage signal $V_{FB}$ applied to respective terminals 406 of the circuit 18. The non-overlapping two phase input signals 102, 104 generally have a constant peak to peak voltage, and may be continuously supplied to the circuit 18. The $\phi 1$ and $\phi 2$ output signals 310, 312 on the other hand, will only appear when STL low is applied to the respective terminals 400 of circuit 18, with a voltage amplitude which is a function of the applied feedback voltage $V_{FB}$ to terminals 406 of circuit 18. The initiation and amplitude control of the $\phi1$, $\phi2$ signals 310, 312 is important to the circuit 10 in the control of the high voltage signal pulse generation. In this regard, the (amplitude modulated) two phase clock signals 310, 312 are applied to the input nodes 410, 412 of the high voltage generator circuit 12 to cause the generation of high voltage signal HV 314 and high voltage control signal HVC 316. The initiation of such voltage generation is shown at reference numerals [812] and [810] on FIG. 2. In the embodiment 10 as shown in more detail in FIG. 3, high voltage is generated by a sixteen-stage charge pump comprising 13 common pump stages 602, 604, 606, 608, 610, 612, 614, 616, 618, 620, 622, 624, 626 and two branches; pump stages 628, 630, 632 and pump stages 629, 631 and 633. The respective pump stages are series connected, and each stage is adapted to reach an asymptotic condition of approximately 3 volts above the previous stage, for a high impedance load, and utilizing square wave, two phase driving clock signals 410, 412 having a peak to peak amplitude of about 5 volts, and a stage device threshold $V_T$ of about 1 volt, if no clamping procedures are applied. Under such conditions of initial application of 5 volt driving signals 410, 412, the output voltage STORE 200 begins to rise [814] as signal HV rises and as signal HVC rises. The output voltage STORE rises by the action of transistor 222 (FIG. 5) which gates high voltage signal HV onto the STORE terminal 200 via the control of the high voltage signal HVC from charge pump stages 629, 631, 633 on the gate of transistor 222. Because the gate of output transistor 222 is a relatively light capacitive load compared to the load on STORE output terminal 200, the voltage of signal HVC will rise faster than the voltage HV. In this regard, the load on the output terminal 200 may be a nonvolatile memory element array.

It is a particular feature of the circuit 10 that the output voltage may be readily controlled in such circuits, and in this regard, the maximum voltage of the signal HVC from charge branch 629, 631, 633 is clamped by the gated diode 650, the reverse bias breakdown characteristics of which is used to provide a high voltage reference element. A cross sectional view of the gated diode 650 is shown in FIG. 6. If the gate of 650 is held at a low voltage, such as zero volts, then for an applied voltage HVC of approximately 25 volts, a sufficient electric field will develop on the gated diode 650 to cause a breakdown in the diode depletion layer. The effect of this is to clamp HVC to approximately 25 volts. This breakdown point is, however, "tuneable" by application gate voltage 651. For instance, if gate voltage 651 is held to +5 volts via transistor 218, then the clamping voltage of HVC is approximately 30 volts. Similarly, if gate 651 of the gated reference diode 650 is held at, for example, zero volts by means of rendering conductive the grounded transistor 220, the clamping voltage of signal HVC generated by charge pump branch 629, 631, 633 would be 25 volts. Although the clamping voltage is a function of dielectric thickness, voltage difference, and doping density, a 25 volt clamping voltage is typical for gated diodes having a gate oxide thickness of about 1000 angstroms. Various gate voltages Vg 651 can be achieved by changing the conductive ratios of the inverter formed by devices 218, 220 (FIG. 5).

During the portion of the charge cycle immediately following initiation of charge pumping, transistors 212, 208 and 210 each have their respective sources 209 at +5 volts because internal control signal $\overline{STL}$ 400 is low. Further, because the gates of transistors 208, 210, 212 are at +5 volts, these transistors are turned off (rendered non-conductive), which permits nodes 500, 502, and HVC high voltage control signal 316 to go positive and not be linked to the common source 209. However, when HVC control signal 316 reaches approximately +25 volts [816] it is clamped at this value by the action of the gated diode reference element 650. The high voltage signal from the other charge pump branch 628, 630, 632, HV 314, however, can continue to rise and the voltage on STORE output terminal 200 will rise until transistor 222 cuts off or is in saturation [822]. Further, increase in output voltage signal HV will not cause STORE to rise. At this point [818] the capacitive load on HV is greatly reduced as transistor 222 cuts off and decouples HV (node 314) from the large capacitance on STORE.

During the rise of voltage at STORE terminal 200, a feedback circuit is operating which actively controls the rise time of STORE. In this connection, as previously noted, the pumping efficiency of the high voltage generator 12 is directly controlled by the amplitudes of the multiphase non-overlapping pump clock signals $\phi1$ 310 and $\phi2$ 312. The application of feedback voltage $V_{FB}$ to nodes 406 in the phase generator 18 directly affects the amplitudes of these pump driving signals $\phi1$ and $\phi2$. If $V_{FB}$ is, for example, zero volts, then $\phi1$ and $\phi2$ at nodes 310, 312 will each be 1.5 volts and, of course, little charge pumping will occur. On the other hand, if feedback voltage $V_{FB}$ is at a maximum level (for the TTL embodiment 10), then the peak amplitude of signals $\phi1$ and $\phi2$ at nodes 310, 312 will be at a maximum amplitude of about 4.8 volts. This corresponds to a range of little pumping to full pumping of the high voltage generator 12, and thereby controls the rise time of the output signal HV and the control signal HVC. The rise time on the STORE pulse at output node or terminal 200 is detected by means of capacitor 350 shown in FIG. 8. In this regard, the potential on node 351 of the feedback circuit is determined by the balance of the displacement current appearing on node 351 via capacitor 350, and the current supplied by transistor 352, which is turned on by the rising potential of node 351.

The feedback voltage $V_{FB}$ 306 utilized to control the driver amplitude and thereby the charge pump generator rise time, is provided by the invertor circuit formed by transistors 356 and 354. The gate of transistor 354 is controlled by node 351. If node 351 is low, transistor 354 is off and the rise time feedback voltage $V_{FB}$ is a maximum, which in turn causes driving signals $\phi1$ and $\phi2$ at output nodes 310, 312 to have maximum voltage and thus cause the high voltage generator 12 to pump at a maximum rate. This case occurs, for example, if the STORE node 200, which is connected to the load impedance, has a very slow rise time. The effect of the resulting maximum $V_{FB}$ voltage is to speed up the rise time of the STORE node 200 by maximizing the charge pumping rate of the charge pump 12. However, when node 351 begins to rise as caused by a relatively more rapid, or fast rise time on the STORE node 200, transistor 354 begins to turn on, which causes the feedback voltage $V_{FB}$ 306 to begin to fall. When a lower feedback voltage $V_{FB}$ is applied to nodes 406 of the circuit 18, charge pump driving signals $\phi 1$ and $\phi 2$ begin to drop in amplitude at nodes 310 and 312, respectively. This causes the high voltage generator 12 to pump at a lower rate, thus slowing down the rise time of the high voltage applied at the STORE node 200.

The range of rise time control depends upon the interrelationship of the size of the load on STORE and the detailed sizes of the high voltage generator, feedback circuit, and phase amplitudes. It should be noted that a wide range of controlled rise times is possible. In particular, the generation of very long rise times is a problem in IC circuit design. This circuit provides high voltage pulses with controlled rise times. A specific example is that this circuit can produce and control pulses in the millisecond range (e.g., 0.1 millisecond to 10 milliseconds). The illustrated embodiment is adapted to control rise times of high voltage pulses for varying load capacitances of from about 50 to about 150 pF, to a rise time range of from about 0.8 to about 1.5 millisecond.

Once the high voltage pulse STORE reaches its maximum voltage as determined by the gated diode clamped voltage reference source HVC (at node 316), a means of detecting this event is provided in the circuit 10. In this regard, such detection is accomplished through the differential HV and HVC signals at nodes 500 and 502, which feed a four-stage network 16 that provides a signal HV SENSE to signal completion of the cycle and initialization of the entire circuit 10.

Referring to FIG. 2, when high voltage control signal HVC reaches its maximum level [816], the STORE node 200 will continue to rise in potential until it reaches its maximum voltage [822] determined by HVC gating transistor 222. At this time [818] the high voltage output signal HV from charge pump branch 628, 630, 632 will begin to rise at a more rapid rate, as STORE node 200 no longer presents a load. At time [818], node 500 is lower than node 502, caused by transistor 206 being provided with a slightly greater threshold voltage than transistor 204. At such time [818], internal logic control signal $\overline{STC}$ provided by control logic circuit 20 is low at nodes 404 and 403, which causes the four-stage network 510, 520, 530 and 540 to respond to potential differences at inputs 500 and 502, and develop an output logic level signal HV SENSE 308. Logic level signal HV SENSE is low for a condition of input node 500 being lower than node 502. HV SENSE is conversely high for a condition of input node 502 being lower than input node 500.

The four-stage difference detector logic system 16 is particularly adapted to function with the relatively high voltage which appear at nodes 500, 502. Stage 510 functions to translate voltages 500 and 502, that are typically about 25 volts, to approximately 2.5 volts. The lower voltages (2-3 volts) are more suitable for further signal amplification and processing. It is important to note that high voltage difference input nodes 500 and 502 interact with Stage 510 only through capacitive (high impedance) coupling, which means the voltages at nodes 500 and 502 are not being loaded down by the sense circuitry, which is often quite important for such high voltage signals. If STORE node 200 is utilized to drive a high impedance load, the high voltage generator 12 need only supply small currents (microamps); it is therefore equally important that the sense technique be also a high impedance scheme such as not to load the high voltage generator 12.

At time [818], the output signal HV from charge pump branch 628, 630, 632 begins to rise quickly as the large STORE load at node 200 has been shed. At time [820] high voltage pulse signal HV has risen sufficiently that node 500 is several volts above node 502, which node has remained substantially constant in potential by virtue of the clamping action of gated diode 650, as STORE has reached its maximum voltage. The potential at node 502 is derived from the potential at STORE node 200 being applied to transistor 204.

The voltage difference between nodes 500 and 502 is translated and amplified by stages 510, 520, 530 and 540 to provide a clean MOS logic level signal HV SENSE at node 308. At time [820] node 500 is greater than node 502 by about 2 volts whereupon HV SENSE goes from low to high (zero volts to +5 volts). During this transition time [824], internal logic signal $\overline{STL}$ similarly goes from low to high [826], which is caused by HV SENSE being applied to node 408 to reset the STORE LATCH circuit 22 by pulling node 130 low. $\overline{STL}$ going high [826] is an end of cycle signal which causes the $\phi 1$ and $\phi 2$ generators to stop oscillating at nodes 310, 312 and remain in a high state by application of $\overline{STL}$ to node 400. With no $\phi 1$, $\phi 2$ oscillations at nodes 410, 412, the high voltage generator stages stop generating higher voltages. Moreover, $\overline{STL}$ high applied to the gate of transistor 216 causes the entire circuit 10 to reinitialize by applying ground potential to node 209. This causes signals HV, HVC, and STORE all to return to low voltage. Because the load on STORE node 200 may be large, some time may be required to return the STORE node 200 to low voltage. Such return of the STORE node low value is detected at time [828] by applying STORE to the gate of transistor 250, which causes internal logic signal $\overline{STC}$ at node 304 to go high, which in turn causes inversely related logic signal STC 302 to go low [830]. $\overline{STC}$ being high at nodes 403 and 404 unconditionally resets the HV SENSE signal to a low potential logic condition of a new cycle. Finally, the STC low condition [832] can be used to signal chip select signal CS to go high (not shown). Setting of the chip select signal CS to a high logic condition now releases the reset STORE LATCH 22 such that it can respond to the initiation of a new cycle by permitting $\overline{STO}$ input 100 (low for a new cycle) to enter the STORE LATCH and start a new cycle.

The device 10 is particularly adapted to provide a controlled rise time high voltage pulse, at a predetermined voltage of about 25 volts with a rise time of about a millisecond, to a plurality of nonvolatile memory cells of the type described in the above identified patent applications. The impedance presented by an array of such cells may vary depending upon operating conditions and number of use cycles, and the provision of a controlled pulse is of importance in the operation of the memory cells. Through the present invention, methods and devices which are particularly adapted to provide such high voltage pulses have been provided, which may readily be incorporated in a monolithic integrated ("on-chip") circuit system with a memory array of such cells. Although the present circuits are not limited to any particular technology, the circuit 10 has been illustrated in terms of parameters resulting from a n-channel MOS process with typical 5 volt power supply and threshold voltage of +0.8 volts.

Having generally described the over-all operation of the circuit 10, various aspects of the circuit will now be described in more detail. In this connection, the high voltage generator 12, which is an important part of the circuit 10, is a 16-stage charge pump driven by two nonoverlapping clocks designated $\phi 1$ and $\phi 2$ (FIGS. 3 and 4). As previously discussed, the series-connected charge pump chain is split three stages from the end, and three small stages are used to generate a high voltage control signal HVC which charges up ahead of the high voltage output signal HV due to its small load 222 until it is clamped by the gated diode 650. The maximum output voltage is determined by the number of stages. Changing the number of stages will also affect the dynamic performance of the chain and is a useful design variable.

The charging rate is proportional to the frequency (f) of the driving clock signals $\phi 1$, $\phi 2$, the effective Bootstrap ratio times the $\phi 1$ and $\phi 2$ voltage swing ($\Delta V$), and the ratio of the load capacitance on HV to the pump capacitor (R).

Using 100 pF as an example for load capacitance value for the illustrated pump capacitance of about 0.35 pF, the ratio R will typically be about 300 (i.e., 100 pF/0.35 pF).

With the feedback circuitry at its normal value ($V_{FB}=4$ V), the $\phi 1$, $\phi 2$ voltage swing is about 4.5 V. Thus, $\Delta V = 80\% \times 4.5$ V, which is approximately equal to 3.5 V.

The graph of FIG. 4 shows the simulated pump voltage V, the number of cycles of $\phi 1$, $\phi 2$ for various values of R and $\Delta V$. By using nonoverlapping clocks the determination of such simulations are greatly simplified.

This graph (FIG. 4) shows for R=100 and $\Delta V=3.5$, that the pump 12 will reach 25 volts in about 1300 cycles. Similarly, for R=300, the 25 volt potential will be reached in about 4000 cycles.

From FIG. 4 it can be appreciated that very high voltages can be practically generated from relatively low voltage clocks. The use of simple nonoverlapping clocks are utilized in the provision of a simple low voltage means for controlling the high voltage generator. The illustrated generator further has a bifurcated split chain design, which allows the generation of two high voltage signals, HV and HVC, which respond to different load conditions.

However, an alternative embodiment of the end stage design of the generator is shown in FIG. 1A, in which the split charge pump chain is not utilized, and a capacitor 652 is added between the gate of transistor 222 and the HV signal output at the end of the staged charge pump element 632. In addition to the advantages of requiring fewer pump stages, the design of FIG. 1A has the further advantage that the current generated by the gated diode 650 is not introduced into the high voltage charge pump chain, thereby effectively increasing the pumping capacity of the chain. The capacitor 652 capacitively isolates the gated diode 650.

In the operation of the embodiment of FIG. 1A, node 314 (HV) causes node 316 (HVC) to rise by capacitive action. When node 316 (HVC) reaches the breakdown voltage determined by the gated diode 650, the voltage of node 316 (HVC) is clamped by the gated diode 650 via line 317. Because the voltage of HVC controls the STORE voltage, the STORE voltage reaches a maximum. As previously described, HV (314) will now rise significantly above HVC and cause the circuit to sense and complete a cycle. Another advantage of capacitively coupling to the gated diode is that a minimum current will be drawn from the gated diode which tends to evidence stability. The design of capacitor 652 is such that it is sufficiently large to dominate all other capacitances on node 316 (HVC).

Although the illustrated generator may be used to drive both high and low impedance loads, the generator size is particularly small for high impedance capacitive type loads. It is clear that a wide range of voltages are practically available from the high voltage generator as illustrated in FIG. 4.

Figure 9:
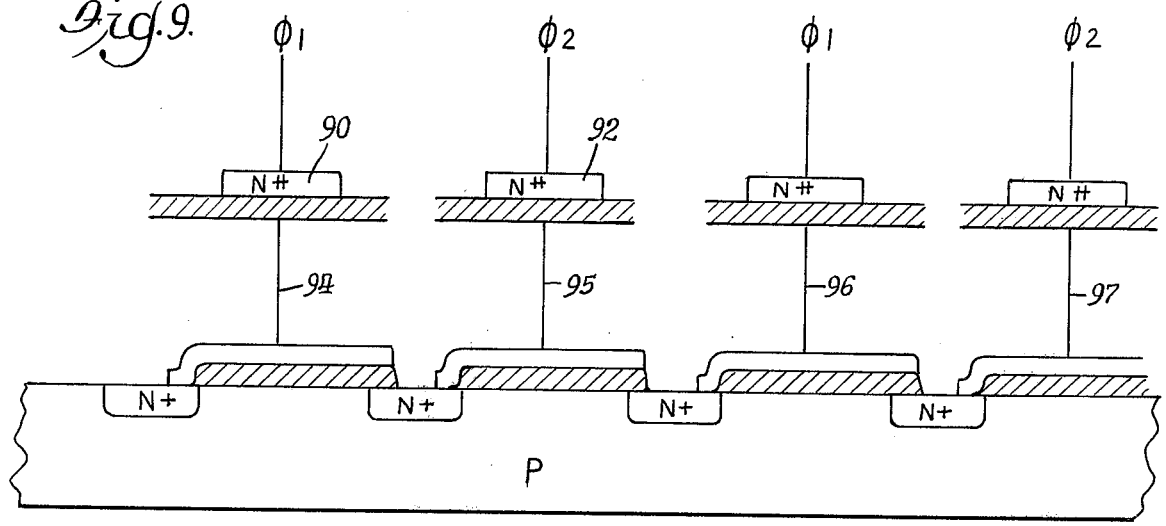
FIG. 9 is a partial, semi-schematic cross sectional view of a charge pump portion of an integrated circuit embodying the subcircuit of FIG. 3.
Figure 10:
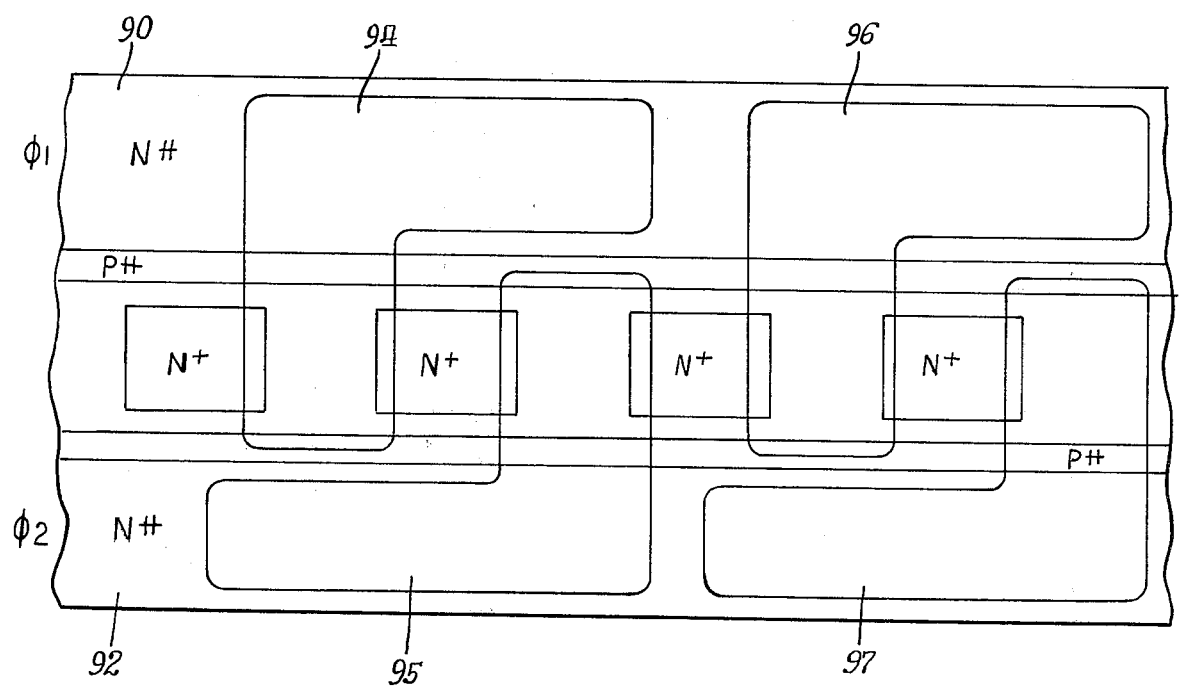
FIG. 10 is a top view of the integrated circuit cross section of FIG. 9.

It will be appreciated that charge pump circuits of the type shown in FIGS. 1 and 1A are particularly suited as a portion of an integrated circuit, and in this regard, FIGS. 9 and 10 illustrate an example of integrated circuit construction of a series of charge pump stages.

As shown in FIGS. 9 and 10, clock signals $\phi 1$, $\phi 2$ may be provided in pn junction isolated N++ channels 90, 92 and be capacitively coupled to electrodes 94, 95, 96, 97, which respectively make electrical contact to one N+ diode island, and are capacitively coupled to an adjacent N+ island in the chain, to form a series-connected charge pump structures as shown in FIG. 1.

Figure 11:
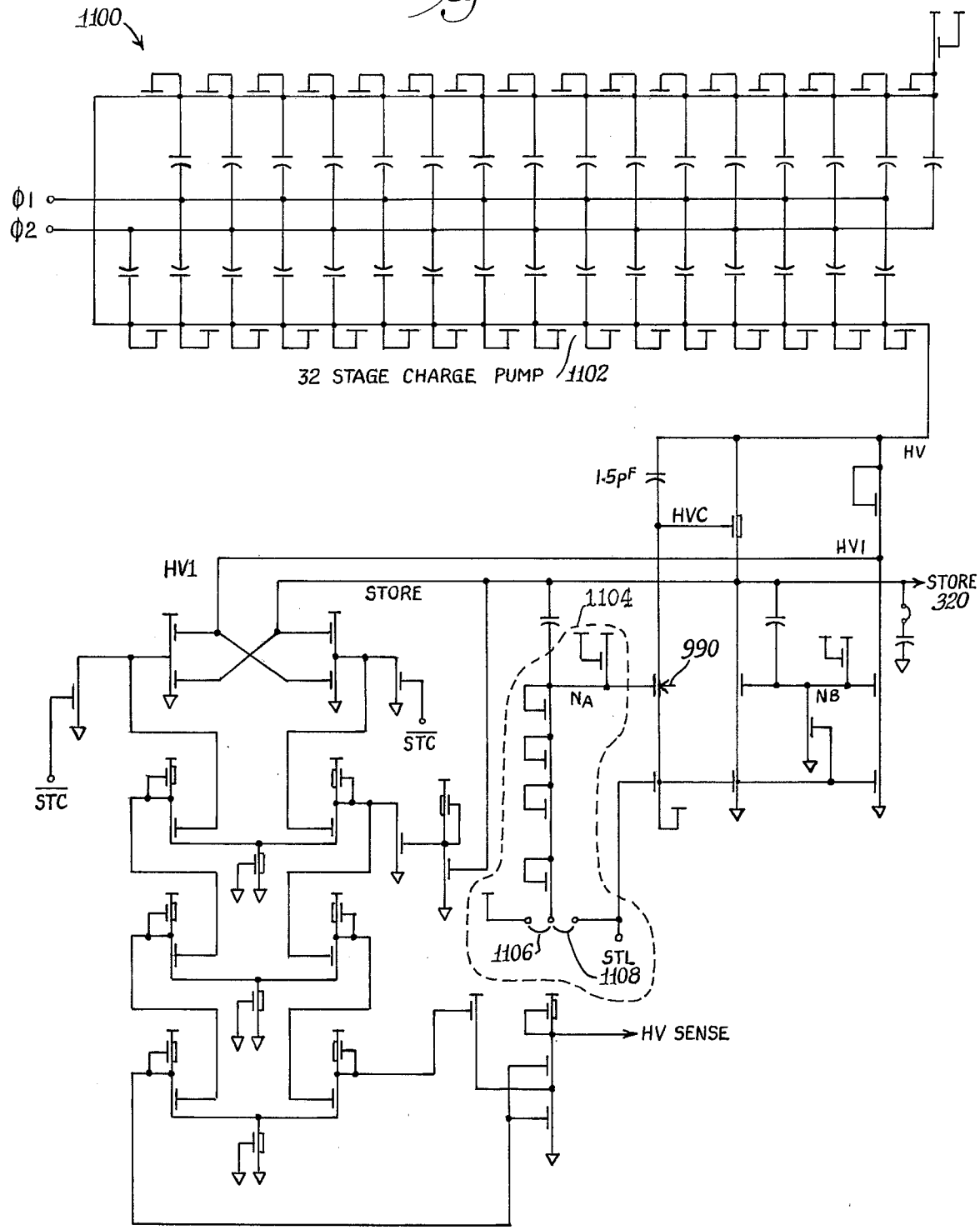
FIG. 11 is a circuit schematic of an alternative embodiment of a generator circuit like that of FIG. 1.

The maximum voltage of the circuit 10 is limited by the high voltage control circuitry, as previously indicated. The high voltage control circuitry (FIG. 5) limits the maximum voltage provided to the STORE output node 200 to about 25 volts in the illustrated embodiment for node 651 at ground potential. However, as mentioned previously, increasing node 651 voltage will readily raise the maximum voltage and an embodiment 1100 of circuitry which utilizes a "tuned" node potential for increasing the maximum voltage is illustrated in FIG. 11, and sends a differential voltage signal to the high voltage sense circuitry when this maximum has been reached.

The HVC signal has very little loading and thus rises ahead of the HV charge pump output until the gated diode 650 clamps it at above 25 V. The exact clamping voltage can be adjusted using a gate voltage option circuit such as shown in FIG. 6, which establishes a selected voltage from 0 to 5 volts on node 651, and which accordingly permits "tuning" or selection of a range of diode breakdown voltages, and associated STORE output voltages.

Once the control voltage HVC has been clamped, STORE node 200 will rise until the transistor device 222 cuts off at about 25 volts ($V_{TD}$ of about zero volts). After the device 222 cuts off, output signal HV is free to rise, unload and eventually pull HV1 node 500 above HV2 node 502.

When internal control signal $\overline{STL}$ goes low (store mode) the device 208 initially sets HV2 above HV1, which has a pull-up transistor 210 with a greater threshold or lower conductance than transistor 208. The gated diode breakdown of these devices is about 30 volts. When the internal logic signal $\overline{STL}$ goes high, transistor 208, 210 and 212 devices discharge the HV nodes to reset the circuit.

As also indicated, a particular feature of the circuit 10 is the use of a gated diode clamp to provide a high voltage reference voltage. Shown in FIG. 6 is a cross section of a gated diode 650, which is a tuneable circuit depending on the voltage difference between the voltage $V_G$ applied to a MOS electrode gate 660, and the voltage HVC applied to the N region 662 of the diode 650. The voltage difference (HVC$-V_G$) establishes a high voltage reference of desirable stability and accuracy. When the difference $HVC-V_G$ is equal to about 25 volts for the device 650 having a 1000 Å thick silicon oxide layer separating gate 650 from the p and n type substrate forming the diode, the diode 650 breakdown clamps the voltage HVC at about 25 volts.

The illustrated gated diode clamp system 650 comprises an N++ region 662 formed in the p-type monocrystalline silicon substrate 655. The high (positive) voltage HVC from the node 316 of the charge pump of FIG. 1, or from node 317 of the embodiment of FIG. 1A, may be applied to the N++ doped region 662 of the diode 650. The p-type side of the diode is thus at a substantially more negative potential (e.g., ground potential in the embodiment 10), so that the diode 650 is highly reverse-biased by virtue of operation of the charge pump 12. The reverse bias produces a depletion region at the pn diode junction, as illustrated in FIG. 6, and a MOS gate 660 is provided adjacent a portion of the pn junction, and isolated therefrom by a suitable dielectric layer which is a 1000 Å silicon dioxide layer 658 in the illustrated embodiment.

The conductive gate may have a gate potential $V_G$ applied thereto, and a region of intense field strength is formed in the region of pn junction immediately adjacent the gate 660 by the voltage difference $HVC-V_G$, which establishes a breakdown reference voltage of about 25 volts for a gate potential $V_G$ of zero volts. The diode breaks down due to the high fields formed in region caused by the presence of the gate electrode 660 and the reverse biased junction. Normally a reverse biased pn silicon junction would breakdown at much higher voltages (e.g., 50–100 volts) if the gate 660 were not present. By changing the gate voltage it is also possible to adjust the breakdown voltage. It is experimentally observed that the gated diode breakdown is well controlled by processing parameters. Gated diode breakdown has been used as a means of protecting MOS circuit inputs from high voltage static electricity, but the gated diode system is used herein to provide an adjustable reliable precision, high voltage reference clamp, which might otherwise require more complex circuit components. Accordingly, it will be appreciated that the use of a gated diode clamp system is a particularly desirable circuit feature for providing a high voltage reference potential.

The high potentials provided by the charge pump 12 also require particular circuit features for logic control signal generation based upon the high voltage signals. As indicated, FIG. 7 illustrates the high voltage sense portion 16 of the circuit 10. An important observation in that the first stage 510 represents a completely high impedance interface to the high voltage signals 500 and 502. Stage 510 also shifts the relatively high voltage to a low level in a single stage. As previously indicated, the output logic level control signal HV SENSE goes high when signal HV1 from node 500 pulls higher than signal HV2 from node 502 (after STORE has reached about 25 V).

In Stage I, the comparison nodes S and S of the circuit 510 are about 2.5 and 2.3 V when input voltage HV1 from node 500 is equal to 27 volts, and input voltage HV2 from node 502 is equal to 25 volts. Differential stages II (520), III (530) and IV (540) have a typical gain greater than 100 providing a large swing to the final level shifting stage V (550).

Before the STORE cycle is started, the internal control signal $\overline{STC}$ at +5 volts (high) applied to node 403 sets the sense amplifier in the HV SENSE=low state (0 volts).

The high voltage control circuitry sets input voltage HV2 above input voltage HV1 when the STORE cycle is started, so HV SENSE will stay low after $\overline{STC}$ is released, until STORE reaches about 25 volts, as previously described.

The rate at which the STORE node 200 reaches the predetermined output voltage is governed by the high voltage feedback circuit (FIG. 8), which senses and regulates the ramp rate of the STORE pulse without any DC loading on STORE. The feedback voltage $V_{FB}$ controls the amplitude of the phase clocks $\phi1$ and $\phi2$ through node 406 (FIG. 1), which in turn directly controls the ramp rate of the high voltage generator (FIG. 3).

An unregulated charge pump 12 would change ramp rate directly as a function of the load capacitance, which varies often by factors exceeding 3 depending on application in the same circuit.

Mathematical simulation shows that with utilization of the feedback circuit, the ramp rate varies only ±20% as the load capacitance varies ±50% which represents a significant improvement. Because the impedance presented by a memory array of nonvolatile memory elements may vary substantially in the course of its operation, and because the provision of optimized high voltage pulses having a generally uniform rise time is desirable for memory array operation, the feedback circuitry is a desirable aspect of the overall circuit 10. In the feedback circuit, means are provided for sensing the ramp rate, and for varying the control output voltage $V_{FB}$ as a function of the rate of potential increase provided by the charge pump 12. The control voltage $V_{FB}$ in turn controls the charge pump pumping rate such that increasing ramp rate causes a decreasing pumping rate, while a decreasing ramp rate causes an increase in the charge pumping rate. In this regard, with respect to the illustrated embodiment 10, as the STORE potential at node 200 ramps to 25 V in 1 millisecond, a displacement current of 7.5 nA from the 0.3 pF feedback capacitor 350 flows through the device 352. In this regard, Z/L ratios for the illustrated transistors of the feedback circuit of embodiment 10 and a capacitance value for feedback capacitor value for the device 10 to be controlled about a ramp rise time of about a millisecond, are set forth as an illustration. This low level conduction of the transistor 352 puts the 10/10 E transistor and the 220/10 E transistor 354 in the prethreshold conduction region. Thus the 220/10 device 354 is conducting about 22 times the current of the device 352 (22×7.5 nA=165 nA). If the ramp rate increases or decreases, this current increases or decreases, respectively, substantially linearly.

The 7/200 D depletion pullup transistor 356 sets $V_{FB}$ at 4 V when the current through the device $I_d$, is 165 nA. The feedback voltage $V_{FB}$ changes about ±0.5 volt for respective ±20% changes in the ramp rate as calculated from circuit simulations. A wide range of circuit regulation is achievable by simply changing circuit parameters, as is clear from the above description and figures.

Each of the various described circuits of the device 10 are particularly suited for realization as a portion of an integrated circuit, and it will be appreciated that methods and devices in accordance with the present invention have particular utility as a portion of an integrated circuit. A particularly important use for such integrated circuits is in chips requiring high voltage, such as potentials in excess of about 15 or 20 volts. At present, such high voltage is often provided as an external power supply which must be controlled, and which adds significant cost to a system design. Methods and devices in accordance with the present invention are especially useful in electrically alterable nonvolatile RAMs and electrically alterable nonvolatile ROM devices as for instance described in above referred to copending patent applications Ser. Nos. 6,026, 6,029, and 6,030, and other devices using charge tunneling principles to achieve nonvolatility. Such methods and devices may also be utilized in fault tolerant integrated circuit chips and electrically reconfigurable microprocessor integrated circuits which use nonvolatile electrically alterable elements to achieve their goals. Integrated circuit high voltage systems in accordance with the invention may also find utility in remotely sensed devices which are normally powerless for long periods of time. In such applications, the circuit may be used to generate a chip power supply by activating the generator by phase clocks supplied from a remote site. Data processing may take place, for example, upon activation of the chips by sending signals synchronized with generator-driving phase clocks so as for instance to take readings of a meter or perform some desired logic function. If the device activated also has a nonvolatile memory which is electrically alterable, a means of storing and modifying data with no local power supply may be provided. It is also possible to transformer-couple the phase clocks to the circuit so that no physical contact is needed to operate the circuit. Such transformer-coupled systems may find utility as medical probe circuitry, for example for medical implants which are adapted to be implanted in a living body without percutaneous leads or other power supply.

Further, as previously indicated, means may be provided for varying the output potential by varying the breakdown potential of the voltage reference element. For example, a preferred embodiment 1100 is shown in FIG. 11, which is similar to the circuitry shown in FIG. 1, but which includes an increase, to thirty-two, in the number of charge pump stages 1102, a capacitive voltage sense circuit arrangement like that of FIG. 1A, and means 1104 for controlling the voltage of the node Na of the gated diode clamp device 990. The means 1104 is a ratioed inverter circuit with theshold dropping diodes which provides for "tuning" of the voltage of node Na of the gated diode clamp, and accordingly controls the voltage at which the diode 990 clamps, or breaks down, and therefore controls the output voltage of the high voltage STORE pulse 320. One end of the inverter circuit 1104 has mask options 1106, 1108 which shift the clamp voltage. The clamp voltage provided by mask option 1106 is about 31 volts, while the clamp voltage provided by mask option 1108 is about 38 volts. In manufacture, one of the options 1106, 1108 will be selected to provide the most desired output voltage for the particular device being manufactured.

Although the invention has been described specifically with reference to a particular circuit embodiment which itself uses device parameters typical of a 5-volt n-channel MOS device and adapted to provide a specified 25 volt pulse having a regulated rise time of about a millisecond, many variations, adaptations and modifications will become apparent from the present disclosure, and are intended to be within the spirit and scope of the present invention as defined by the accompanying claims.

Various features of the invention are set forth in the following claims.

What is claimed is:

1. An integrated high voltage generating circuit comprising:
   clock signal means for providing multiphase charge pumping signal,
   charge pump means for utilizing said charge pumping signal for pumping charge packets along a plurality of discrete stages of increasing potential to provide an output potential at an output terminal which exceeds the potential of the charged pumping signal,
   means for limiting said output potential to a predetermined reference potential, and
   means for controlling the rise time of said output potential said means including means for minimizing the effect of any change in output impedance at said output terminal on said output potential rise time.

2. The integrated circuit of claim 1 wherein said charge pump means comprises a plurality of series connected diode devices each capacitively connected to said clock signal means.

3. The integrated circuit of claim 2 wherein said clock signal means provides two-phase, nonoverlapping signals which are alternatingly capacitively coupled to said series-connected diode devices.

4. The integrated circuit of claim 2 further including means for generating a logic-level control signal when said output potential exceeds said predetermined reference potential.

5. An integrated high voltage generating circuit comprising:
   clock signal means for providing a multiphase charge pumping signal;
   charge pump means utilizing said charge pumping signal for pumping charged packets along a plurality of discrete stages of increasing potential to provide an output potential at an output terminal which exceeds the potential of the charge pumping signal, said means including a plurality of series connected diode devices, each capacitively connected to said clock signal means;
   means for limiting said output potential to a predetermined reference potential; and
   means for controlling the rise time of said output potential comprising means for sensing said rise time, means for increasing the amplitude of said charge pumping signal with a slower rise time having been sensed and for decreasing the amplitude of said charge pumping signal with a faster rise time having been sensed with respect to a predetermined, desired rise time, so as to accommodate a variable output impedance at said output terminal without correspondingly variable rise time variation.

6. An integrated high voltage generating circuit comprising:
   clock signal means for providing a multiphase charge pumping signal;
   charge pump means for utilizing said charge pumping signal for pumping charged packets along a plurality of discrete stages of increasing potential to provide an output potential at an output terminal which exceeds the potential of the charge pumping signal, said means including a plurality of series connected diode devices, each capacitively connected to said clock signal means;

means for limiting the output potential to a predetermined reference potential comprising a reverse biased p-n junction diode having an electrode gate adjacent at least a portion of the p-n junction of said diode and dielectrically separated therefrom to provide a voltage clamp at a predetermined clamping potential of at least about 25 volts and means for sensing when the output potential exceeds said clamping potential; and means for controlling the rise time of said output potential.

7. An integrated high-voltage generating circuit comprising:

clock signal means for providing a multiphase charge pumping signal;

charge pump means for utilizing said charge pumping signal for pumping charge packets along a plurality of discrete stages of increasing potential to provide an output potential at an output terminal which exceeds the potential of the charge pumping signal, said charge pump means including a plurality of series connected diode devices, each capacitively connected to said clock signal means, and means for generating a second output potential;

means for limiting said output potential to a predetermined reference potential;

means for controlling the rise time of said output potential;

means for enabling one of said output potentials to rise to a voltage beyond said predetermined reference potential after said first output potential has reached said predetermined reference potential;

means for detecting when the differential voltage created between said first and second output potentials exceed a predetermined level; and means responsive to said detection means for discharging said charge pump means.

8. An integrated high voltage generating circuit comprising:

clock signal means for providing a multiphase charge pumping signal;

charge pump means for utilizing said charge pumping signal for pumping charge packets along a plurality of discrete stages of increasing potential to provide a first output voltage pulse which exceeds the potential of the charge pumping signal and to provide a second output voltage pulse which exceeds the potential of the charge pumping signal;

means responsive to an input signal for causing said charge pumping signal to be coupled to said charge pump means;

means for limiting said first output voltage pulse to a predetermined reference potential;

means for coupling one of said output voltage pulses to an output terminal;

means for enabling said second output voltage pulse to rise to a voltage beyond said predetermined reference potential once said first output voltage pulse has reached said predetermined reference potential;

means for detecting the differential voltage between said first and second voltage pulses; and means responsive to said detection means for causing said means responsive to an input signal to be disabled and said charge pump means to discharge when said differential voltage exceeds a predetermined level.

9. The integrated high voltage generating circuit of claim 8 further comprises means for controlling the rise time of said first output voltage pulse to counteract the effect of any changes in the output impedance at said output terminal on the rise time of said first output potential voltage pulse.

10. The integrated high voltage generating circuit of claim 8 wherein said means for controlling the rise time of said first output voltage pulse comprises means for continuously sensing the rise time of said first output voltage pulse during the period of said rise time, and means for amplitude modulating said charge pumping signal as a function of the extent that said sensed rise time varies from a predetermined rise time.

11. The integrated high voltage generator circuit of claim 8 wherein said means for limiting said first output voltage pulse to a predetermined reference potential comprises a reverse biased p-n junction diode having an electrode gate adjacent at least a portion of the p-n junction of said diode and dielectrically separated therefrom to provide a voltage clamp at a predetermined clamping potential of at least about 25 volts and means for coupling said p-n junction diode to said output terminal.

12. The integrated high voltage generator circuit of claim 8 wherein said output voltage pulse coupling means comprises:

a gating transistor controlled by said first output voltage pulse for decoupling said second output voltage pulse from said output terminal once said first output voltage pulse is limited to said predetermined reference potential and said second output voltage pulse at least equals said reference potential.

* * * * *